(12) United States Patent
Soe et al.

(10) Patent No.: US 6,351,485 B1
(45) Date of Patent: Feb. 26, 2002

(54) SPREAD SPECTRUM MODULATION TECHNIQUE FOR FREQUENCY SYNTHESIZERS

(75) Inventors: Zaw M. Soe, Santa Clara; Ewunnet Gebre-Selassie, Milpitas; Mingde Pan, Morgan Hill, all of CA (US)

(73) Assignee: Fairchild Semiconductor Corporation, South Portland, ME (US)

( * ) Notice: Subject to any disclaimer, the term of this patent is extended or adjusted under 35 U.S.C. 154(b) by 0 days.

(21) Appl. No.: 09/149,770

(22) Filed: Sep. 8, 1998

(51) Int. Cl.[7] ................................................ H04B 1/69
(52) U.S. Cl. ...................... 375/130; 375/376; 331/11; 327/105
(58) Field of Search ................................ 375/130, 146, 375/376; 455/260; 331/10, 11, 14, 17, 23; 327/105

(56) References Cited

U.S. PATENT DOCUMENTS

| | | | | |
|---|---|---|---|---|
| 5,610,955 A | * | 3/1997 | Bland ........................... | 37/376 |
| 5,872,807 A | * | 2/1999 | Booth et al. ................. | 375/200 |
| 6,046,646 A | * | 4/2000 | Lo et al. ........................ | 331/10 |

* cited by examiner

Primary Examiner—Amanda T. Le
(74) Attorney, Agent, or Firm—Skjerven Morrill MacPherson LLP; Philip W. Woo

(57) ABSTRACT

A spread spectrum modulation technique uses digital control logic to switch back and forth between two feedback divider ratios so that the PLL spreads output clock frequency between two limits determined by the ratios. The spread spectrum control logic can be integrated into any PLL frequency synthesizer.

17 Claims, 3 Drawing Sheets

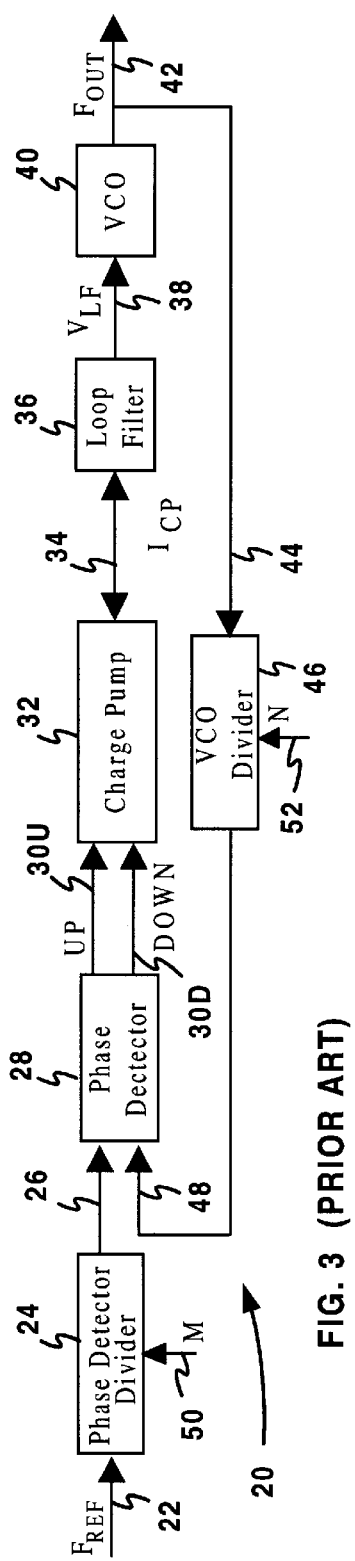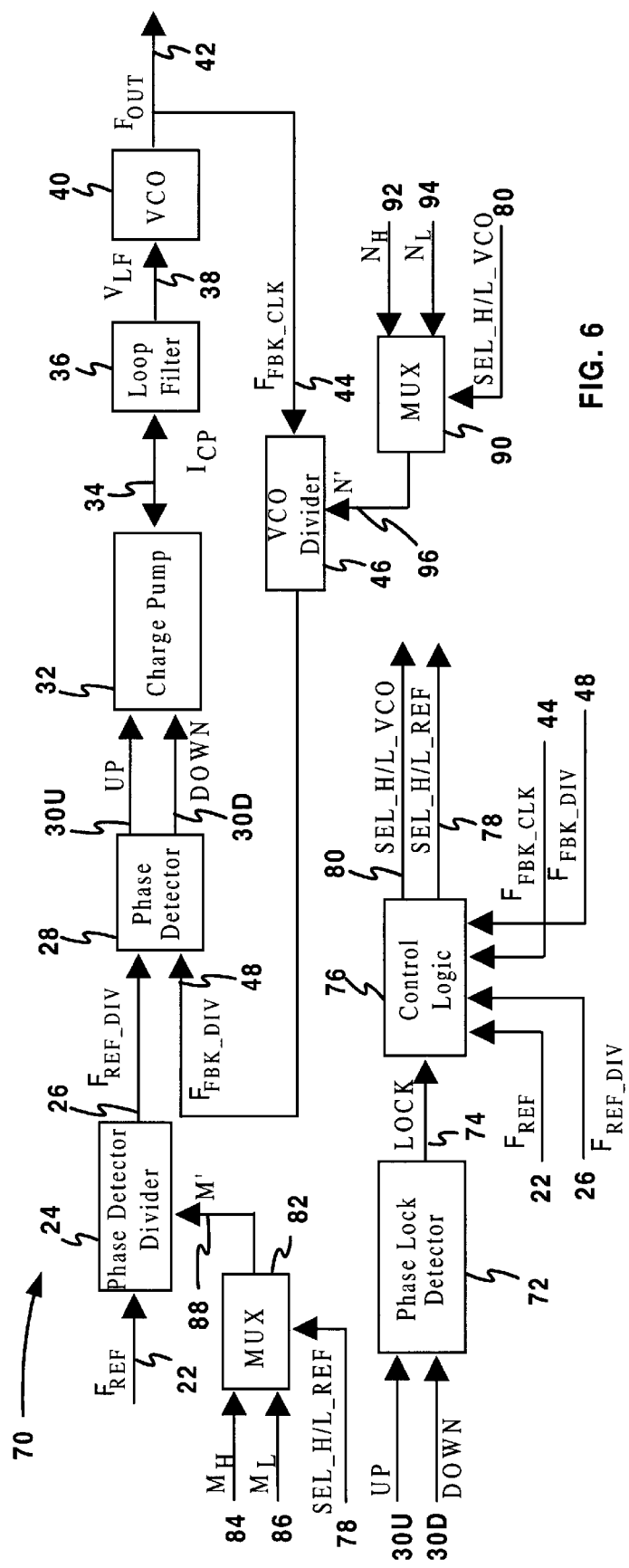

SPREAD SPECTRUM MODULATION TECHNIQUE FOR FREQUENCY SYNTHESIZERS

TECHNICAL FIELD

This invention relates generally to phase locked loops for frequency synthesizers and more particularly to phase locked loops for frequency synthesizers which require a spread spectrum feature.

BACKGROUND ART

A frequency synthesizer that has a phase lock loop (PLL) uses a reference signal to generate a desired clock at generally higher frequencies. At these high frequencies, the clock causes electromagnetic interference (EMI) which disturbs proper operation of electronics devices nearby. To prevent disturbance, synthesizers are required to shield and isolate the clock. Depending on the peak amplitude of the clock, the shielding can be a significant additional cost for manufactures.

The higher the peak amplitude is, the worse the EMI. Thus, it is desirable to be able to reduce the peak amplitude while maintaining the high frequency. It has been determined that this can be accomplished by spreading the output clock frequency from the nominal frequency where the peak occurs to other frequencies which are just slightly above and below the nominal frequency.

The spectrum amplitude can be reduced without curtailing logic HIGH and LOW level by spreading the output clock frequency from the nominal frequency with an external reference frequency. In personal computer applications, microprocessor clock frequency is targeted to spread within −0.5% from nominal frequency with 30 kHz to 50 kHz signals. Such a spread spectrum clock has been very difficult to develop.

There are several ways the spread spectrum clocks have been implemented in the past. Some used a separate divider circuit to generate a constant modulation frequency such as 30 kHz to 50 kHz. Some multiplexed between two clock sources. Others modulated a control voltage, $V_{LF}$, with a triangle wave. However, such clock sources had sub-optimal reductions in amplitude spectrum. Moreover, the frequency spreading would not be within the desired specification and vary over the process, and with changes in voltage and temperature.

While there has been some consideration given to developing digital solutions to the frequency spreading requirement, the difficulty of controlling such a digital solution and preventing the PLL from destabilizing has prevented such a solution.

Consequently, there exists a need for a spread spectrum modulation technique to precisely spread the clock frequency within specific range over the process and with changes in voltage and temperature without use of a constant reference frequency source.

DISCLOSURE OF THE INVENTION

The present invention provides a spread spectrum modulation technique which uses digital control logic to switch back and forth between two feedback divider ratios so that the PLL spreads output clock frequency between two limits determined by the ratios. The spread spectrum control logic can be integrated into any PLL synthesizer.

The present invention provides a technique which eliminates the need for complex modulation circuits.

The present invention further provides a technique which eliminates the need for triangle modulation frequency.

The present invention still further provides a technique which eliminates the need for a constant modulation frequency source.

The present invention still further provides for the elimination of a portion of the shielding and isolation required for non-spread spectrum high frequency clocks.

BRIEF DESCRIPTION OF THE DRAWINGS

FIG. 3 (PRIOR ART) shows a schematic of a typical PLL clock frequency synthesizer;

FIG. 6 is a schematic of the spread spectrum PLL of the present invention; and

BEST MODE FOR CARRYING OUT THE INVENTION

Figure 1:
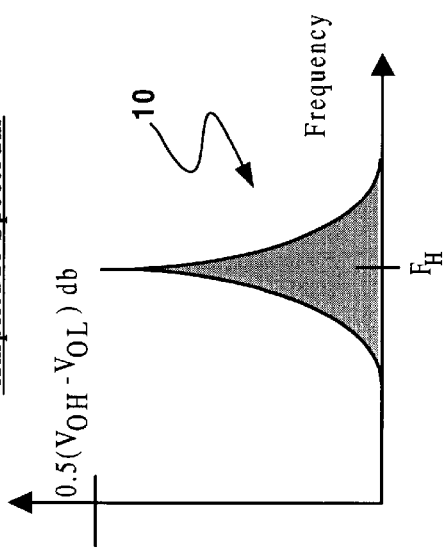
FIG. 1 (PRIOR ART) shows a graph with the basic PLL clock amplitude spectrum.

Referring now to FIG. 1 (PRIOR ART), therein is shown a graph of a basic phase lock loop (PLL) clock amplitude spectrum 10. The peak amplitude of the clock is at $F_H$. The signal has $V_{OL}$ at logic LOW and $V_{OH}$ at logic HIGH. Therefore, the fundamental AC peak amplitude of the clock is approximately half of $V_{OH}-V_{OL}$ in db.

Figure 2:
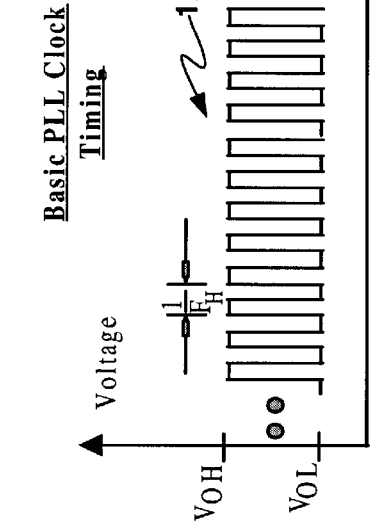
FIG. 2 (PRIOR ART) shows a graph with the basic PLL clock timing.

Referring now to FIG. 2 (PRIOR ART), therein is shown a basic PLL clock timing 12 showing the voltage range from $V_{OL}$ to $V_{OH}$, and the period of $1/F_H$.

Referring now to FIG. 3 (PRIOR ART), therein is shown a typical charge-pump based PLL frequency synthesizer 20. The PLL frequency synthesizer 20 has a reference frequency inputted as $F_{REF}$ 22 into a phase detector divider 24. The phase detector divider 24 provides a divided reference frequency $F_{REF\_DIV}$ 26 to a phase detector 28. The phase detector 28 provides an up signal 30U or a down signal 30D to a charge pump 32. The signals are selectable but generally set with the up signal 30U and the down signal 30D being provided depending on the phase and frequency of $F_{REF\_DIV}$, respectively leading and lagging the phase of $F_{VCO\_DIV}$ 48. The charge pump 32 controls current, $I_{CP}$ 34, to a loop filter 36. The loop filter 36 provides a low frequency voltage, $V_{LF}$ 38, to a voltage control oscillator (VCO) 40. The VCO 40 provides the output frequency, $F_{OUT}$ 42, of the PLL frequency synthesizer 20.

The $F_{OUT}$ 42 is fed back through feedback line 44 to a VCO divider 46 which is connected to provide a divided feedback signal which is a divided VCO frequency, $F_{VCO\_DIV}$ 48, to the phase detector 28. The divide factor for the phase detector 28 is M 50 from the phase detector divider 24 and is N 52 from the VCO divider 46.

Figure 4:
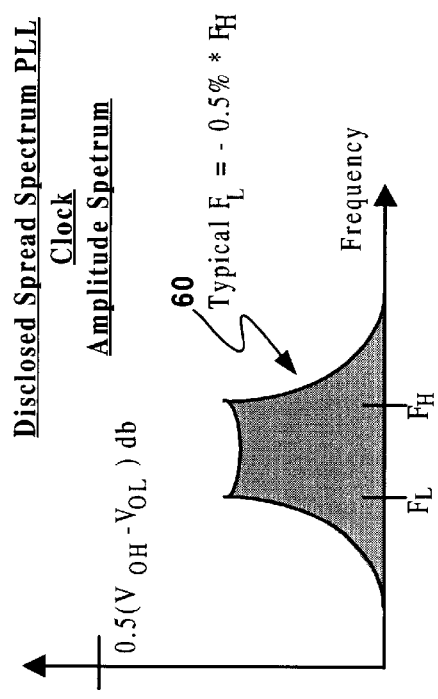
FIG. 4 is a graph of a spread sprectrum PLL clock amplitude spectrum of the present invention.

Referring now to FIG. 4, therein is shown a spread spectrum PLL clock amplitude spectrum 60 of the present invention. The peak amplitudes are shown at $F_H$ and $F_L$. $F_L$ is shown for microprocessor applications as being less than −0.5% times $F_H$. The clock signal is also shown as being substantially below the fundamental AC amplitude of the PLL clock amplitude spectrum 10.

Figure 5:
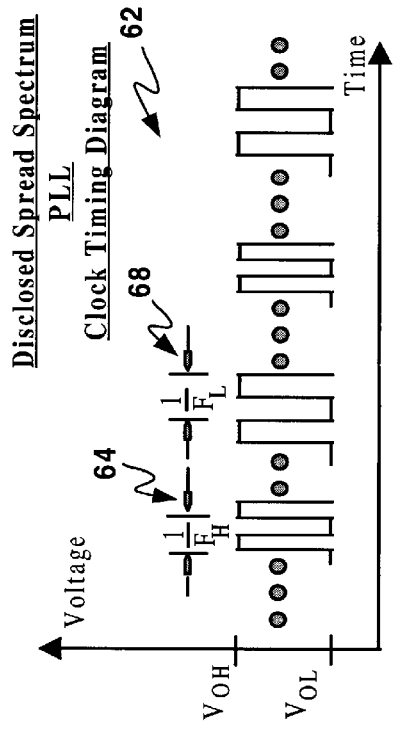
FIG. 5 is a graph of the spread spectrum PLL clock timing diagram of the present invention.

Referring now to FIG. 5, therein is shown a spread spectrum PLL clock timing diagram 62 with the $F_H$ pulses being shown at 64 and the $F_L$ pulses being shown at 68. The rise to rise intervals are shown as $1/F_H$ and $1/F_L$, respectively.

Referring now to FIG. 6, therein is shown a spread spectrum PLL frequency synthesizer 70 of the present invention. Where the components are the same as in the typical charge pump-based PLL frequency synthesizer 20, the same numbers are used.

The outputs of the phase detector 28, which are up and down signals 30U and 30D, respectively, are used as inputs to the phase lock detector 72. The output of the phase lock detector 72 is a lock signal 74 which is inputted to control logic 76. The inputs to the control logic 76 include $F_{REF}$ 22, $F_{REF\_DIV}$ 26, the feedback clock 44, and the $F_{VCO\_DIV}$ 48. The outputs of the control logic 76 are select high/low reference, SEL_H/L_REF 78, and select high/low VCO, SEL_H/L_VCO 80.

The SEL_H/L_REF 78 is provided to a multiplexer, MUX 82, which has a high phase detector divider value $M_H$ 84 and a low value $M_L$ 86. The output of the MUX 82 is provided as the phase detector divider value M' 88.

The SEL_H/L_VCO 80 is provided to a multiplexer, MUX 90, which has high and low VCO divider values $N_H$ 92 and $N_L$ 94. The output of the MUX 90 is a VCO divider value N' 96.

Figure 7:
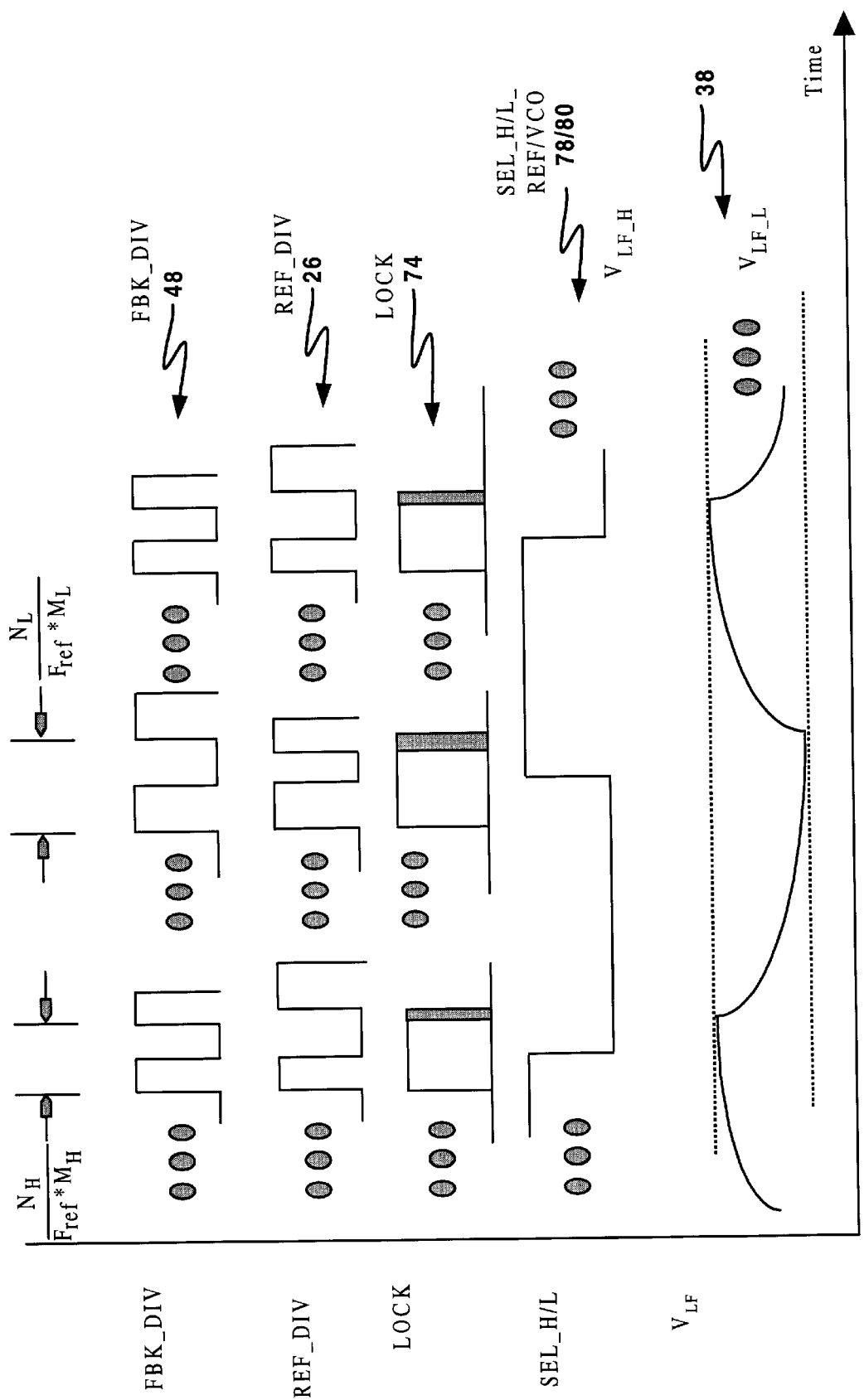
FIG. 7 is a graph of the synchronization system of an alternate embodiment of the present invention.

Referring now to FIG. 7, therein is shown a graph of the signals where the spread spectrum PLL frequency synthesizer 70 has the divider values switched at the beginning of each count and synchronized with $F_{REF}$ 22 to provide improved spectrum spreading.

In operation in the prior art PLL frequency synthesizer 20 of FIG. 3, $F_{REF}$ 22 is provided to the phase detector divider 24 where it is divided by the value M 50. The $F_{REF\_DIV}$ 26 along with $F_{VCO\_DIV}$ 48 are inputted to the phase detector 28 where any phase difference causes either an up or down signal 30U or 30D to be provided to the charge pump 32 depending on which signal leads. The phase detector 28 is in its locked position when the $F_{REV\_DIV}$ 26 and the $F_{VCO\_DIV}$ 48 are exactly the same, the output $F_{OUT}$ 42 is as follows:

$$F_{OUT} = F_{REF} \frac{N}{M} \quad (1)$$

where $F_{OUT}$ Frequency Output of PLL, $F_{REF}$ Input Reference Frequency $N$ Voltage Controlled Oscillator(VCO) Divider Value $M$ Phase Detector Divider Value.

In operation with the spread spectrum PLL frequency synthesizer 70 of FIG. 6, $F_{OUT}$ 42 will have the PLL output clock frequency spread out within $F_H$ and $F_L$ as given by:

$$F_H = F_{REF} \frac{N_H}{M_H} \text{ and } F_L = F_{REF} \frac{N_L}{M_L} \quad (2)$$

where $F_H$      Upper Limit or Nominal Clock Frequency $F_L$      Lower Limit Clock Frequency $F_{REF}$    Input Reference Frequency $N_H$ or $N_L$    VCO Divider Value that synthesizes $F_H$ or $F_L$ $M_H$ or $M_L$   Phase Detector Divider Value that synthesis $F_H$ or $F_L$ An ideal phase lock detector 72 would generate a binary output, lock signal 74 when the phase differences between the two inputs, UP signal 30U and the DOWN signal 30D, are equal to a constant value.

In practice, the phase detector 28 outputs, UP signal 30U and DOWN signal 30D, force the input frequencies to be equal and the phase error to be constant. In addition, the frequency difference between divider ratios M' 88 and N' 96 are relatively close, about 0.5%. Hence, the uses of phase detector 28 output only require the phase lock detector 72 to be sensitive enough to the deadband.

As would be obvious to those having ordinary skill in the art, the phase lock detector 72 can be implemented with digital logic gates that reset an integrator, a technique which is insensitive to process, and changes in temperature and voltage. Therefore, a precise lock condition can be detected.

The main function of the control logic 76 is to switch back and forth between two feedback divider ratios for $F_H$ and $F_L$. Since there are two divider ratios, the loop has two lock conditions. Once a locked condition is detected, the control logic switched back to previous ratio so that the clock frequency is spread over the two limits.

In the microprocessor clock specification, the amount of spread is strictly to be within −0.5% from the non-spread frequency. Therefore, the control voltage $V_{LF}$ must move slowly towards the voltage that synthesizes the next frequency limit. In addition, the longer the loop stays in the locked condition, the greater the spectrum energy at $F_H$ or $F_L$.

For this reason, as soon as the loop reaches into the locked condition, the control logic 76 must switch the divider ratio. As a result, there is an excess phase due to a step change at phase detector's reference input. With proper synchronization, the maximum phase error will be within:

$$\Delta\phi_{H \to L} = N_L \left( \frac{1}{F_H} - \frac{1}{F_L} \right) \text{ and } \Delta\phi_{L \to H} = N_H \left( \frac{1}{F_L} - \frac{1}{F_H} \right) \quad (3)$$

where $\Delta\phi_{H \to L}$ maximum phase error between REF_DIV and VCO_DIV when the divider values $N_L$ is selected.

$\Delta\phi_{L \to H}$ maximum phase error between REF_DIV and VCO_DIV when the divider values $N_H$ is selected.

TABLE 1

An Example of Phase Error Calculation Given by Equation (3).

|  | REF (MHz) | FOUT (MHz) | PDF (kHz) | PDF (kHz) | Phase Err. (sec) | N | M | |
|---|---|---|---|---|---|---|---|---|
| Non Spread Mode | 14.3180 | 99.8182 | 409.0909 | 899.2628 | 5.438E-9 | 244 | 35 | H |
| Spread Mode | 14.3180 | 99.3324 | 894.8863 | 407.0999 | 11.955E-9 | 111 | 16 | L |

Since $F_H$ and $F_L$ are relatively close, equation (3) will not cause abrupt changes in control voltage and the loop slowly tracks the small step change. This process continues as long as the control logic 76 is enabled. FIG. 4 shows an example of control voltage waveform when the control logic 76 is enabled.

A further enhancement is done by synchronization. The lock signal 74 is sampled with the reference divider signal, $F_{REF\_DIV}$ 26, so the dividers will always divide $M_H$ or $M_L$ without exceeding $M_H$. This is simply done by changing the divider values at the beginning of the count and synchronizing to the reference clock signal, $F_{REF}$ 22. A similar concept is applied for switching N divider values. FIG. 7 illustrates the timing diagram of control logic signals.

The signals from top to bottom are the VCO divider signal, $F_{VCO\_DIV}$ 48, the reference divider signal, $F_{REF\_DIV}$ 26, the lock signal 74, the select high/low signals, SEL__H/L__REF 78 and SEL__H/L__VCO 80, and the loop filter voltage, $V_{LF}$ 38. A phase error between the VCO divider signal, $F_{VCO\_DIV}$ 48 and the reference divider signal, $F_{REF\_DIV}$ 26 is shown by the gray area in the lock signal 74.

While the invention has been described in conjunction with a specific best mode, it is to be understood that many alternatives, modifications, and variations will be apparent to those skilled in the art in light of the aforegoing description. Accordingly, it is intended to embrace all such alternatives, modifications, and variations which fall within the spirit and scope of the included claims. All matters set forth herein or shown in the accompanying drawings are to be interpreted in an illustrative and non-limiting sense.

The invention claimed is:

1. A phase lock loop frequency synthesizer having a reference frequency divideable by a first value and a feedback frequency divideable by a second value, the synthesizer comprising:
   a first system for providing a plurality of first values;
   a second system for providing a plurality of second values;
   a detector for detecting the difference between the divided reference frequency and the divided feedback frequency to provide an indication thereof; and
   a control system responsive to said detector output for determining when to apply said plurality of said first and second values whereby the synthesizer provides a spread spectrum output frequency.

2. The synthesizer as claimed in claim 1 including:
   a lock detector for determining when the divided reference frequency is equal to the divided feedback frequency to provide a lock signal; and
   said control system is responsive to said lock signal to change the application of said plurality of first and second values.

3. The synthesizer as claimed in claim 2 wherein said control system is responsive to said lock signal and said divided reference frequency to change said application of said first value when said signals are synchronized.

4. The synthesizer as claimed in claim 2 wherein said control system is responsive to said lock signal and said divided feedback frequency to change said application of said second value when said signals are synchronized.

5. The synthesizer as claimed in claim 1 wherein said first system includes a multiplexer for applying a high or low value to divide said reference frequency.

6. The synthesizer as claimed in claim 1 wherein said first system includes a multiplexer for applying a high or low value to divide said feedback frequency.

7. The synthesizer as claimed in claim 1 wherein said control system uses said reference frequency and said divided reference frequency to change said application of said plurality of first values.

8. The synthesizer as claimed in claim 1 wherein said control system uses said feedback frequency and said divided feedback frequency to change said application of said plurality of said second values.

9. A phase locked loop frequency synthesizer having a reference frequency divideable by a first value and a feedback frequency divideable by a second value, both of which are provided to a detector for providing signals in response to phase differences in the divided reference and feedback frequencies, the synthesizer comprising:
   a first system for providing a high and a low of the first value;
   a second system for providing a high and a low of the second value;
   a lock detector for detecting the signals from the detector and providing a lock signal when the phases of the divided reference and feedback frequencies are the same;
   control logic responsive to said lock signal to cause said first and second systems to provide change between said high and low of the first and second values whereby the synthesizer provides a spread spectrum output frequency within a predetermined spectrum.

10. The synthesizer as claimed in claim 9 wherein the detector for providing signals provides up or down signals in response to the divided reference frequency leading or lagging the divided feedback frequency wherein:
    said control logic is responsive to said up or down signals to cause said first and second systems to provide both high or both low first and second values.

11. The synthesizer as claimed in claim 10 wherein:
    said control logic is responsive to said lock signal to cause said first and second systems to change from both high or both low first and second values to both low or both high first and second values.

12. The synthesizer as claimed in claim 9 wherein said first system includes a multiplexer for applying a high or low first value to divide said reference frequency.

13. The synthesizer as claimed in claim 9 wherein said first system includes a multiplexer for applying a high or low second value to divide said feedback frequency.

14. The synthesizer as claimed in claim 9 wherein said control system is responsive to said lock signal and said divided reference frequency to change said application of said first value when said signals are in phase.

15. The synthesizer as claimed in claim 9 wherein said control system is responsive to said lock signal and said divided feedback frequency to change said application of said second value when said signals are in phase.

16. The synthesizer as claimed in claim 9 wherein the output frequency of the synthesizer is a spread spectrum within a predetermined range.

17. The synthesizer as claimed in claim 9 wherein the output frequency of the synthesizer is a spread spectrum with the lower frequency 0.5% lower than the higher frequency.

* * * * *